(12) United States Patent
Giusti et al.

(10) Patent No.: US 10,875,307 B2
(45) Date of Patent: Dec. 29, 2020

(54) METHOD FOR MANUFACTURING A FLUID-EJECTION DEVICE WITH IMPROVED RESONANCE FREQUENCY AND FLUID-EJECTION VELOCITY, AND FLUID-EJECTION DEVICE

(71) Applicant: STMICROELECTRONICS S.R.L., Agrate Brianza (IT)

(72) Inventors: Domenico Giusti, Caponago (IT); Marco Ferrera, Concorezzo (IT); Carlo Luigi Prelini, Seveso (IT); Mauro Cattaneo, Sedriano (IT); Andrea Nomellini, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 16/249,752

(22) Filed: Jan. 16, 2019

(65) Prior Publication Data

US 2019/0217618 A1    Jul. 18, 2019

(30) Foreign Application Priority Data

Jan. 17, 2018  (IT) .................. 102018000001152

(51) Int. Cl.
| | | |
|---|---|---|
| *B41J 2/16* | (2006.01) | |
| *B41J 2/14* | (2006.01) | |
| *B81C 1/00* | (2006.01) | |

(52) U.S. Cl.
CPC ......... *B41J 2/1626* (2013.01); *B41J 2/14201* (2013.01); *B41J 2/161* (2013.01);
(Continued)

(58) Field of Classification Search
CPC .... B41J 2/1626; B41J 2/1623; B41J 2/14201; B41J 2/1607; B41J 2/1632
(Continued)

(56) References Cited

U.S. PATENT DOCUMENTS

| | | | |
|---|---|---|---|
| 8,633,553 B2 | 1/2014 | Ferrera et al. | |
| 8,864,287 B2 * | 10/2014 | Huffman | B41J 2/14427 347/11 |

(Continued)

FOREIGN PATENT DOCUMENTS

| | | |
|---|---|---|
| CN | 106926582 A | 7/2017 |
| CN | 210082663 U | 2/2020 |

(Continued)

OTHER PUBLICATIONS

Takahashi, "Adaptability of Piezoelectric Inkjet Head," *NIP17: International Conference on Digital Printing Technologies*, Sep. 30-Oct. 5, 2001, pp. 323-327.

*Primary Examiner* — An H Do
(74) *Attorney, Agent, or Firm* — Seed IP Law Group LLP

(57) ABSTRACT

A method for manufacturing a device for ejecting a fluid, including the steps of: forming, in a first semiconductor wafer that houses a nozzle of the ejection device, a first structural layer; removing selective portions of the first structural layer to form a first portion of a chamber for containing the fluid; removing, in a second semiconductor wafer that houses an actuator of the ejection device, selective portions of a second structural layer to form a second portion of the chamber; and coupling together the first and second semiconductor wafers so that the first portion directly faces the second portion, thus forming the chamber. The first portion defines a part of volume of the chamber that is larger than a respective part of volume of the chamber defined by the second portion.

20 Claims, 8 Drawing Sheets

(52) U.S. Cl.
CPC .......... *B41J 2/1606* (2013.01); *B41J 2/1607* (2013.01); *B41J 2/1623* (2013.01); *B41J 2/1628* (2013.01); *B41J 2/1629* (2013.01); *B41J 2/1631* (2013.01); *B41J 2/1632* (2013.01); *B41J 2/1642* (2013.01); *B81C 1/00087* (2013.01); *B41J 2002/14241* (2013.01)

(58) Field of Classification Search
USPC .................................... 347/54, 56, 68, 70
See application file for complete search history.

(56) References Cited

U.S. PATENT DOCUMENTS

| | | |
|---|---|---|
| 8,944,573 B2 * | 2/2015 | Yokoyama ............. B41J 2/1643 347/70 |
| 8,969,105 B2 | 3/2015 | Hoisington et al. |
| 8,998,388 B2 | 4/2015 | Cattaneo et al. |
| 9,744,765 B2 | 8/2017 | Giusti et al. |
| 2012/0018819 A1 | 1/2012 | Ferrera et al. |
| 2013/0242000 A1 | 9/2013 | Faralli et al. |
| 2014/0313264 A1 | 10/2014 | Cattaneo et al. |
| 2017/0182778 A1 | 6/2017 | Cattaneo et al. |

FOREIGN PATENT DOCUMENTS

| | | |
|---|---|---|
| JP | 2009190349 A | 8/2009 |
| WO | 2012018561 A1 | 2/2012 |

\* cited by examiner

METHOD FOR MANUFACTURING A FLUID-EJECTION DEVICE WITH IMPROVED RESONANCE FREQUENCY AND FLUID-EJECTION VELOCITY, AND FLUID-EJECTION DEVICE

BACKGROUND

Technical Field

The present disclosure relates to a method for manufacturing a fluid-ejection device and to a fluid-ejection device.

Description of the Related Art

Known in the prior art are multiple types of fluid-ejection devices, in particular inkjet heads for printing applications. Similar heads, with appropriate modifications, may likewise be used for ejection of fluids other than ink, for example for applications in the biological or biomedical field, for local application of biological material (e.g., DNA) in the manufacture of sensors for biological analyses, for decoration of fabrics or ceramics, and in 3D-printing and additive-production applications.

Known manufacturing methods envisage coupling via gluing or bonding of a large number of pre-machined parts; however, said method is costly and requires high precision, and the resulting device has a large thickness.

To overcome the above drawbacks, U.S. Pat. Pub. No. 2014/0313264 discloses a method for manufacturing a fluid-ejection device, which is completely provided on silicon substrates with technologies typically used for manufacturing semiconductor devices and is obtained by coupling just three wafers.

U.S. Pat. Pub. No. 2017/182778 discloses a further method for manufacturing a fluid-ejection device of an improved type. In particular, the steps for manufacturing the nozzle are carried out on the corresponding wafer prior to coupling of the latter to the other wafers for formation of the finished device. In addition, there is envisaged formation of a layer with high wettability within the hole that defines the nozzle in a simple and inexpensive way. Finally, also in this case, the manufacturing process envisages coupling of just three wafers, thus reducing the risks of misalignment and limiting the manufacturing costs.

The step of coupling between wafers envisages that they have a certain thickness greater than a minimum thickness, to enable handling thereof via the tools typically used during bonding. Both of the fluid-ejection devices mentioned above have a feeding channel arranged between the fluid-containment chamber and the nozzle for ejection of the fluid contained in the chamber. This channel forms a path for feeding the fluid, from the chamber to the nozzle, through a structural layer having the function of increasing the thickness of the corresponding wafer in which the channel itself is formed, for the purposes discussed above.

The present applicant has found that the presence of the above feeding channel may cause, in given operating conditions, a deterioration of the resonance frequency of the print head and may likewise affect the velocity of fluid ejection from the nozzle, thereby reducing it.

BRIEF SUMMARY

Embodiments are directed to a method for manufacturing a fluid-ejection device and a corresponding fluid-ejection device. In particular, one or more embodiments are directed to methods for manufacturing fluid-ejection heads based upon piezoelectric technology, and corresponding fluid-ejection heads based upon piezoelectric technology.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
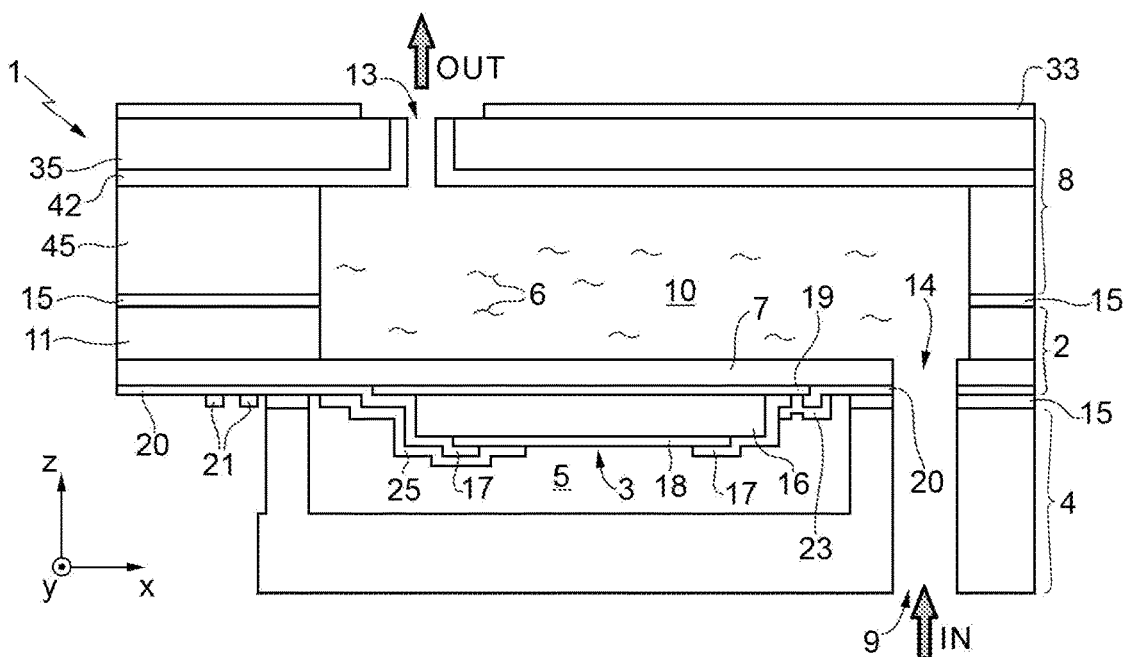
FIG. 1 shows, in lateral sectional view, a fluid-ejection device in accordance with an embodiment of the present disclosure.

Fluid-ejection devices based upon piezoelectric technology may be manufactured by bonding or gluing together a plurality of wafers previously machined by micromachining technologies typically used for manufacturing MEMS (Micro-Electro-Mechanical Systems) devices. In particular, with reference to FIG. 1, a liquid-ejection device 1 is illustrated according to an aspect of the present disclosure. With reference to FIG. 1, the liquid-ejection device 1 comprises a first wafer 2, a second wafer 4, and a third wafer 8.

The first wafer includes a substrate 11 and at least one piezoelectric actuator 3, which is designed to be governed for generating a deflection of a membrane 7 coupled thereto. The membrane 7 extends partially suspended over at least one chamber 10 that defines a reservoir for containing fluid 6 to be expelled during use.

The second wafer 4 defines at least one containment chamber 5 of the piezoelectric actuator 3 configured to isolate, in use, the piezoelectric actuator 3 from the fluid 6 to be ejected, and further has at least one inlet channel 9 for the fluid 6, in fluidic connection with the chamber 10.

The third wafer 8 includes a body made, for example, of polysilicon (designated by the references 35 and 45), and at least one channel 13 for ejection of the fluid 6 (ejection nozzle), which is formed in part through the polysilicon body, provided with a hydrophilic region 42 (made, for example, of $SiO_2$), and is configured to arrange the chamber 10 in fluid communication with an environment external to the liquid-ejection device 1.

The aforementioned wafers 2, 4, 8 are coupled together by soldering-interface regions, and/or bonding regions, and/or gluing regions and/or adhesive regions, which are made, for example, of polymeric material and are designated as a whole by 15 in FIG. 1.

The piezoelectric actuators 3 comprise a piezoelectric region 16 arranged between a top electrode 18 and a bottom electrode 19, designed to supply an electrical signal to the piezoelectric region 16 for generating, in use, deflection of the piezoelectric region 16, which consequently causes deflection of the membrane 7 in a per se known manner. Metal paths (designated as a whole by the reference 20) extend from the top electrode 18 and the bottom electrode 19 towards an electrical contact region, provided with contact pads 21 designed to be biased by bonding wires (not illustrated).

There now follows a description, with reference to FIGS. 2-12, of a process for manufacturing the fluid-ejection device 1, according to an embodiment of the present disclosure.

Figure 2:
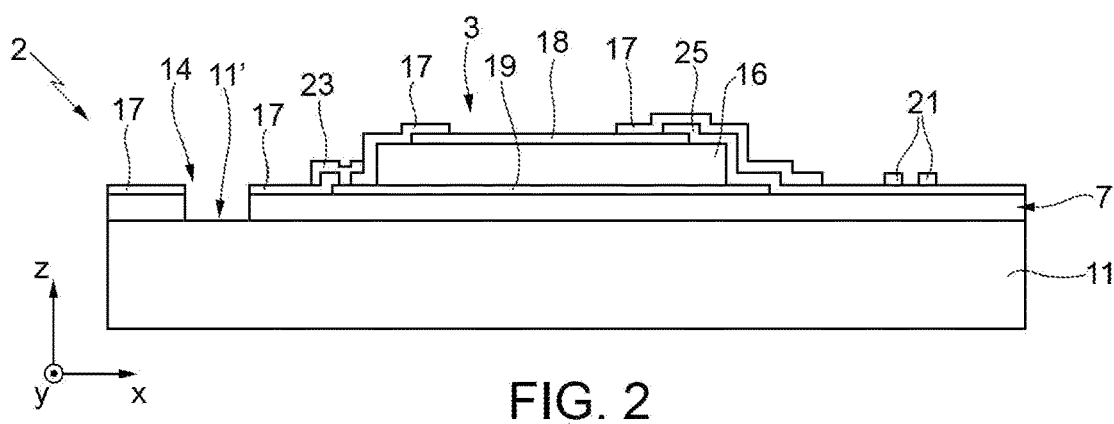
FIGS. 2-12 show steps for manufacturing the fluid-ejection device of FIG. 1, according to one embodiment.
Figure 3:
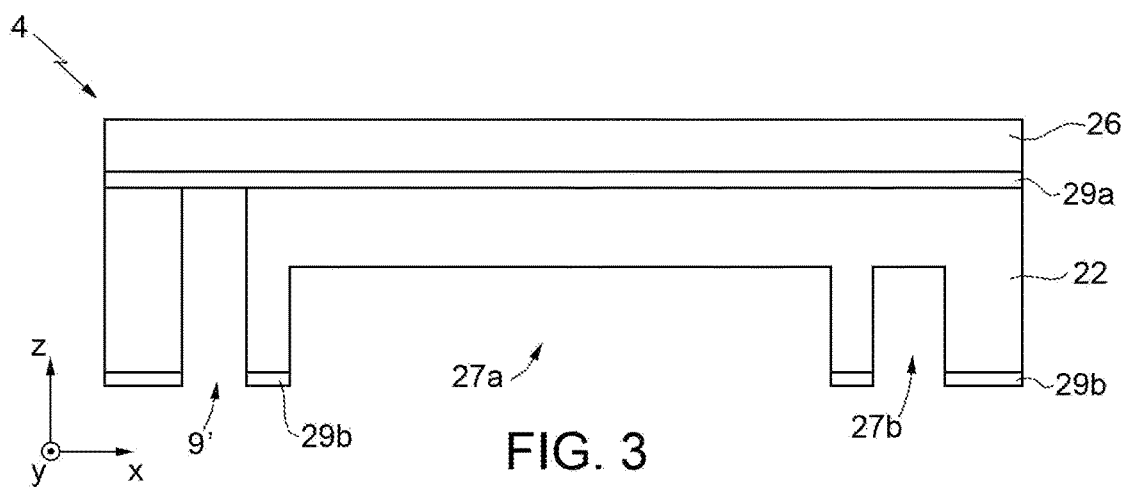
Figure 4:
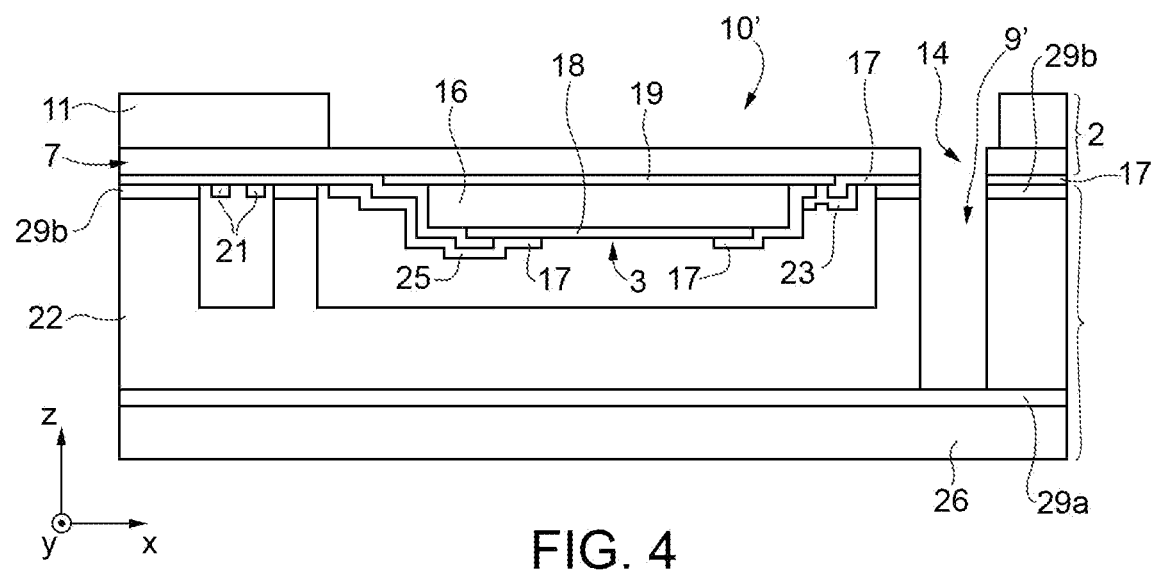

In particular, FIGS. 2-4 describe steps of micromachining of the first and second wafers 2, 4; FIGS. 5-12 describe steps of micromachining of the third wafer 8.

In particular, with reference to FIG. 2, the steps of fabrication of the first wafer 2 in brief envisage, first of all, providing the substrate 11 of semiconductor material (e.g., silicon). Then, formed on said substrate is a membrane layer 7, for example including a stack of $SiO_2$-polysilicon-$SiO_2$, where the $SiO_2$ layers have a thickness comprised, for example, between 0.1 and 2 μm, and the polysilicon layer (grown epitaxially) has a thickness comprised between 1 and 20 μm. In various embodiments, the membrane may be made of other materials typically used for MEMS devices, for example $SiO_2$ or else SiN, having a thickness comprised between 0.5 and 10 μm, or else a stack in various combinations of $SiO_2$—Si—SiN.

This is followed by formation, on the membrane layer 7, of the bottom electrode 19 of the piezoelectric actuator 3 (for example, formed by a $TiO_2$ layer with a thickness comprised between 5 and 50 nm, deposited on which is a Pt layer with a thickness comprised between 30 and 300 nm).

There then follows deposition of a piezoelectric layer on top of the bottom electrode 19 by depositing a layer of PZT (Pb, Zr, $TiO_3$), having a thickness comprised between 0.5 and 3.0 μm, more typically 1 or 2 μm (which will form, after subsequent steps of definition, the piezoelectric region 16). Next, deposited on the piezoelectric layer is a second layer of conductive material, for example Pt or Ir or IrO2 or TiW or Ru, having a thickness comprised between 30 and 300 nm, to form the top electrode 18.

The electrode and piezoelectric layers are subjected to lithographic and etching steps, for patterning them according to a desired pattern, thus forming the bottom electrode 19, the piezoelectric region 16, and the top electrode 18.

One or more passivation layers 17 are then deposited on the bottom electrode 19, the piezoelectric region 16, and the top electrode 18. The passivation layers include dielectric materials used for electrical insulation of the electrodes, for example, layers of $SiO_2$, or SiN, or $Al_2O_3$, either single, or in stacks arranged on top of one another, having a thickness comprised between 10 nm and 1000. The passivation layers are then etched in selective regions, to creating trenches for access to the bottom electrode 19 and to the top electrode 18. This is then followed by a step of deposition of conductive material, such as metal (e.g., aluminum or else gold, possibly together with barrier and adhesion layers such as Ti, TiN, TiW or Ta, TaN), within the trenches thus created and on the passivation layers 17. A subsequent patterning step enables formation of conductive paths 23, 25, which enable selective access to the top electrode 18 and to the bottom electrode 19 in order to bias them electrically during use. It is further possible to form further passivation layers (e.g., of $SiO_2$ or SiN, not illustrated) for protecting the conductive paths 23, 25. Conductive pads 21 are likewise formed alongside the piezoelectric actuator, electrically coupled to the conductive paths 23, 25.

Finally, the membrane layer 7 is selectively etched in a region thereof that extends alongside, and at a distance from, the piezoelectric actuator 3, to expose a surface region 11' of the underlying substrate 11. A through hole 14 is thus formed through the membrane layer 7, which enables, in subsequent manufacturing steps, formation of a fluidic path from outside the fluid-ejection device 1 towards the reservoir 10, through the inlet channel 9, as illustrated in FIG. 1.

With reference to the second wafer 4 (illustrated in FIG. 3), the manufacturing steps envisage providing a substrate 22 of semiconductor material (e.g., silicon) with a thickness of, for example, 400 μm, which is provided with one or more dielectric layers 29a, 29b (e.g., layers of $SiO_2$ or SiN or combinations thereof) on both sides. On a top face of the second wafer 4, deposited on the dielectric layer 29a, is a structural polysilicon layer 26, with a thickness comprised between 1 and 20 μm, for example 4 μm.

Then, machining steps are carried out on the bottom face, opposite to the top face, of the second wafer 4. In particular, the second wafer 4 is etched in the region where the inlet channel 9 is to be formed by removing selective portions of the dielectric layer 29b and of the substrate 22 throughout the thickness thereof and etching a deep trench 9' (with etch stop at the dielectric layer 29a). During the etching step, or in a further step of etching of the bottom face of the second wafer 4, likewise formed are a recess 27a, which will subsequently constitute the containment chamber 5, and a recess 27b, which, in subsequent steps, will face the region of the first wafer 2 that houses the conductive pads 21. According to one aspect of the present disclosure, the recesses 27a, 27b thus formed have a depth, along Z, comprised between 50 and 300 μm.

With reference to FIG. 4, the first and second wafers 2, 4 thus produced are then coupled together (e.g., by wafer-to-wafer bonding technique) so that the containment chamber 5 completely contains the piezoelectric actuator 3 and so that the through hole 14 made through the membrane 7 is aligned, and in fluidic connection, with the trench 9' etched through the substrate 22 of the second wafer 4. A stack of wafers is thus obtained.

The substrate 11 of the wafer 2 is machined so as to reduce the thickness thereof. In particular, a step of CMP (Chemical Mechanical Polishing) or grinding is carried out in order to reach a final thickness of the substrate 11 that is, for example, comprised approximately between 5 μm and 200 μm. In this connection, it may be noted that reduction of the thickness of the substrate 11 is carried out after the step of coupling between the first and second wafers 2, 4. In this way, handling of the wafers to enable them to be joined together is not jeopardized or rendered problematical.

The wafer 2 is then subjected to lithographic and etching steps in a per se known manner. In particular, the substrate 11 of the wafer 2 is etched so as to form a cavity on the side opposite to the side that houses the piezoelectric actuator 3, through which the silicon-oxide layer that forms the membrane 7 is exposed.

This step enables release of the membrane 7, rendering it suspended, and at the same time formation of a first portion 10' of the chamber 10. A small thickness of the substrate 11 is advantageous, in this step of definition of the membrane 7, in so far as it enables a high control of the size of the membrane 7 in a way substantially independent of the etching technique used. In fact, also in the case of isotropic etching or etching that proceeds not parallel to the axis Z, the impact on the final size of the membrane 7 (as compared to the size defined lithographically) decreases with the reduction of the thickness of the substrate 11 (in other words, the area of the membrane 7 is all the more conformable to the photolithographic mask used, the smaller the thickness of the substrate 11). Control of the area of the membrane and, in particular, of its width, is important both for determination of the resonance frequency and for the volume of liquid displaced by the membrane when it is actuated.

The thickness of the substrate 11 further defines the volume of the first portion 10' of the chamber 10. According to one aspect of the present disclosure, the volume defined by the first portion 10' is comprised between 10% and 60% of the total volume designed for the chamber 10, and more in particular between 10% and 20%.

There now follows a description, according to an aspect of the present disclosure, of steps machining of the third wafer 8.

Figure 5A:
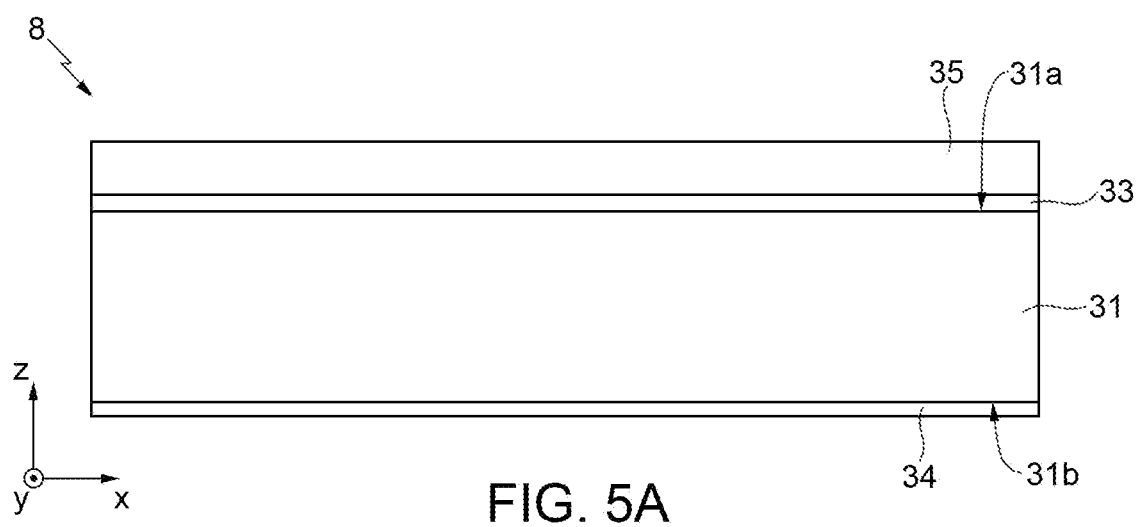

With reference to FIG. 5A, the third wafer 8 is provided, including a substrate 31, for example having a thickness of approximately between 400 and 800 µm, in particular approximately 600 µm. The substrate 31 is made, according to an embodiment of the present disclosure, of semiconductor material, such as silicon. The substrate 31 has a first surface 31a and a second surface 31b, opposite to one another in a direction Z. Formed on the first surface 31a by thermal oxidation is a first interface layer 33, of silicon oxide ($SiO_2$). The step of thermal oxidation typically entails formation of an oxide layer 34 also on the back of the substrate 31, on the second surface 31b. The first interface layer 33 (and, likewise, the back oxide layer 34) has, for example, a thickness of approximately between 0.2 µm and 2 µm.

Figure 5B:
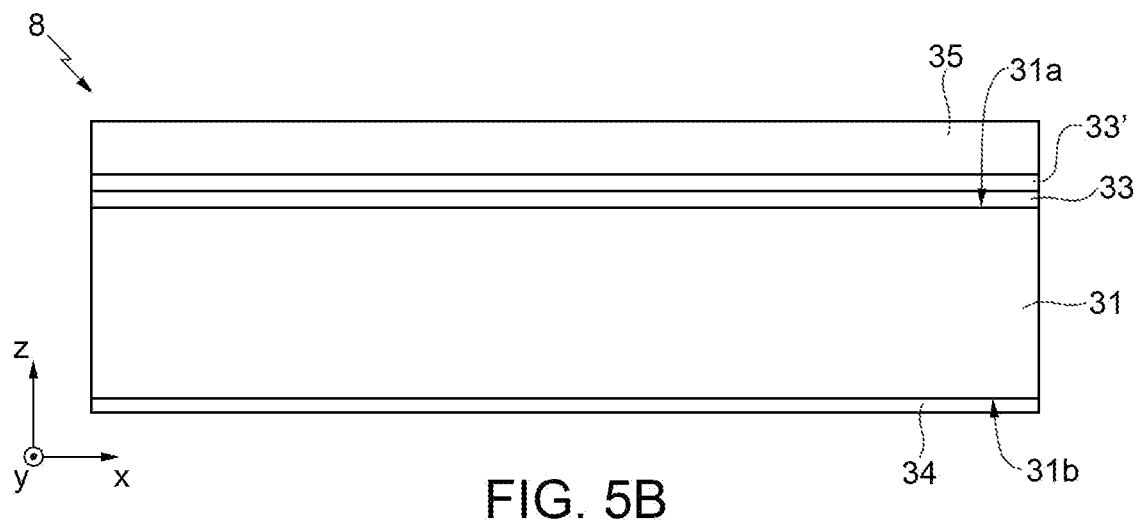

According to a further embodiment of the present disclosure, illustrated in FIG. 5B, it is possible to form on the interface layer 33 (or as an alternative thereto) one or more further anti-wettability layers 33', which have hydrophobic characteristics, i.e., are designed to provide anti-wettability functions for the nozzle 13 subsequently obtained. These layers are made of materials typically formed by silicon, in compounds containing hydrogen or carbon or fluorine, for example, $Si_xH_x$, SiC, SiOC.

Formed on the first interface layer 33 (or on the one or more further anti-wettability layers, if present) is a nozzle layer 35, may, for example, of epitaxially grown polysilicon, having a thickness of approximately between 10 and 75 µm.

The nozzle layer 35 may be made of a material other than the polysilicon, for example silicon or some other material still, provided that it may be removed selectively with respect to the material of which the first interface layer 33 (or the anti-wettability layer, if present) is formed.

Figure 6A:
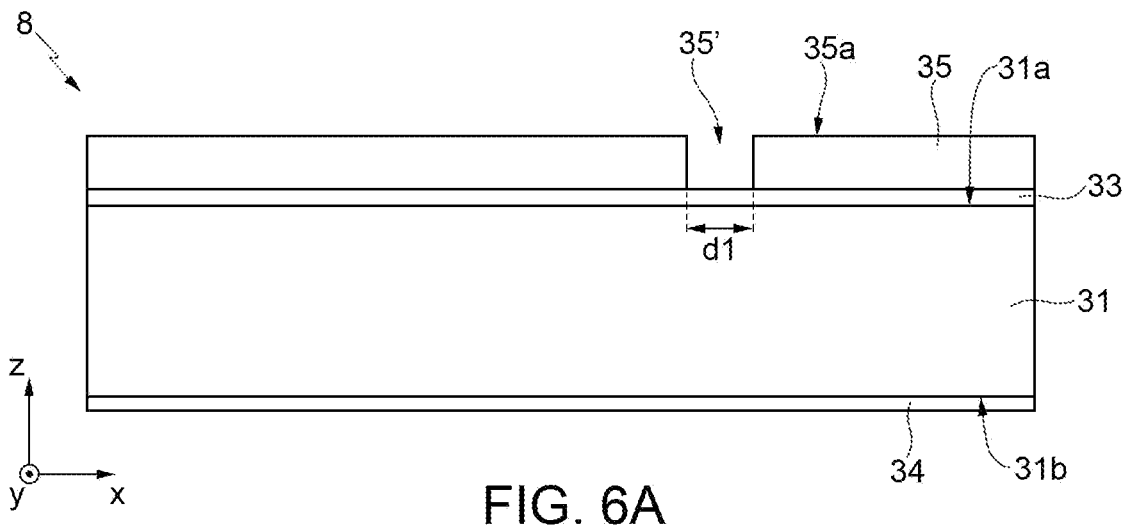

With reference to FIG. 6A, a photoresist mask (not illustrated) is deposited on an exposed top surface 35a of the nozzle layer 35 and, by subsequent lithographic and etching steps, a through hole 35' is formed through the nozzle layer 35, until a surface region of the interface layer 33 is exposed. In the case where one or more further anti-wettability layers 33' are present on the interface layer 33, said further layers are etched and removed in this process step so as to be self-aligned during complete opening of the nozzle.

Etching is carried out using an etching chemistry capable of selectively removing the material of which the nozzle layer 35 is made (here, polysilicon), but not the material of which the interface layer 33 is made (here, silicon oxide). The profile of etching of the intermediate layer 35 may be controlled by choosing an etching technology and an etching chemistry in order to obtain the desired result.

For instance, with reference to FIG. 6A, using an etch of a dry type (RIE or DRIE) with standard silicon-etching chemistries used in the semiconductor industry (SF6, HBr, etc.) it is possible to obtain a through hole 35' with substantially vertical side walls along Z. The through hole 35' forms the ejection nozzle of the fluid-ejection device 1. However, as described more fully with reference to FIG. 7, subsequent manufacturing steps envisage formation of a covering layer (reference number 42 in FIG. 7) on the inner walls of the through hole 35', which thus causes a narrowing thereof.

The covering layer 42 is, in particular, a layer presenting good characteristics of wettability, for example a layer of silicon oxide ($SiO_2$). The covering layer 42 is considered to have good characteristics of wettability when it presents a reduced angle of contact with a drop of liquid (typically, a water-based liquid or inks of different fluids) deposited thereon. The solid-liquid interaction, as is known, may be assessed in terms of angle of contact of a drop of fluid deposited on the surface considered, measured as angle formed at the surface-liquid interface. A small angle of contact is due to the tendency of the drop to flatten out on the surface, and vice versa. In general, a surface is considered hydrophilic when it presents characteristics of wettability such that, when a drop is deposited thereon, the angle of contact between the surface and the drop (angle θ) has a value of less than 90°, in particular equal to or less than approximately 20° (this facilitates expulsion of any possible air bubble trapped within the chamber displacing it from the walls). A surface is, instead, considered as hydrophobic if it presents characteristics of wettability such that, when a drop is deposited thereon, the angle of contact between the surface and the drop (angle θ) has a value greater than 90°.

Consequently, assuming a through hole 35' of a circular shape, in top plan view, the diameter $d_1$ thereof is chosen larger than the desired diameter for the ejection nozzle, as a function of the thickness envisaged for the covering layer of the inner walls of the through hole 35'.

Figure 6B:
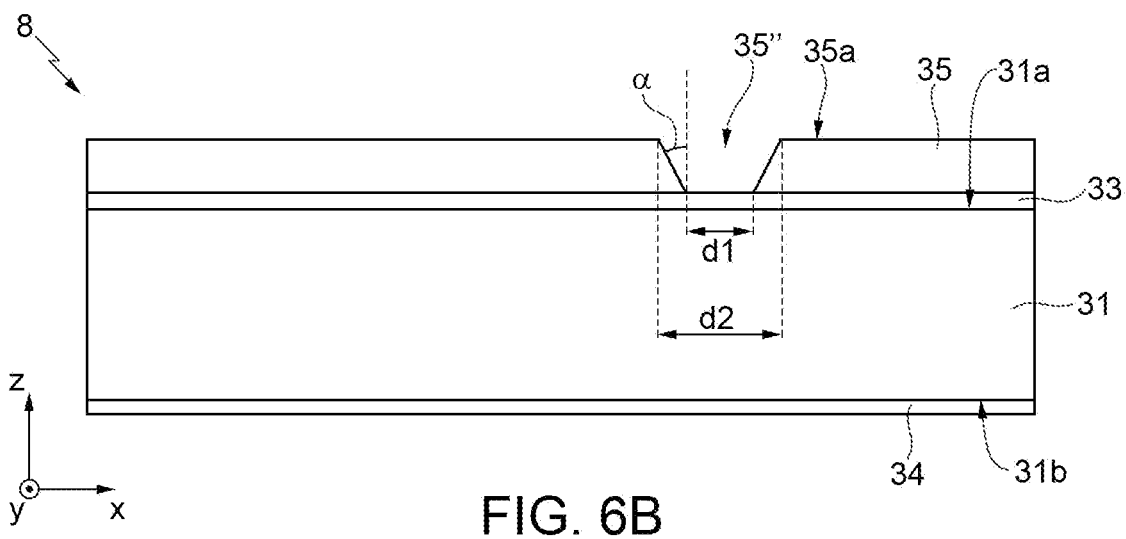

Alternatively, as illustrated in FIG. 6B, using an etch of a dry type (with the etching chemistries referred to above) or a wet type (with TMAH or KOH etching chemistry) it is possible to obtain a through hole 35" with inclined side walls, which extend, in particular, in lateral sectional view, with an angle α of from 0° to 37° with respect to the direction Z. In FIG. 6B, the through hole 35" has a top base opening (at the top surface 35a of the nozzle layer 35) of a circular shape and with a diameter $d_2$ larger than the diameter $d_1$ of the bottom base opening (through which the interface layer 33 is exposed); i.e., it extends in the form of a conical frustum. Also in this case, since subsequent manufacturing steps envisage formation of the covering layer (reference number 42 in FIG. 7) on the inner walls of the through hole 35", the base diameters $d_1$ and $d_2$ are small. Consequently, assuming a through hole 35" having a circular shape in top plan view, the base diameters $d_1$ and $d_2$ thereof are chosen larger than the desired value for the ejection nozzle, as a function of the thickness envisaged for the covering layer of the inner walls of the through hole 35".

The step of formation of the through hole 35' or 35", according to the respective embodiments, is followed by the step of removal of the photoresist mask and, if desired, by a step of cleaning of the top surface 35a of the nozzle layer 35 and of the side walls internal to the through hole 35', 35". This step, carried out by removal in oxidizing environments at a high temperature (>250° C.) and/or in aggressive solvents, has the function of removing undesired polymeric layers that may form during the previous etching step.

In what follows, a through hole 35' of the type illustrated in FIG. 6A will be described, without this implying any loss of generality. What has been described, in fact, applies without significant variations also to the wafer machined as illustrated in FIG. 6B.

Figure 7:
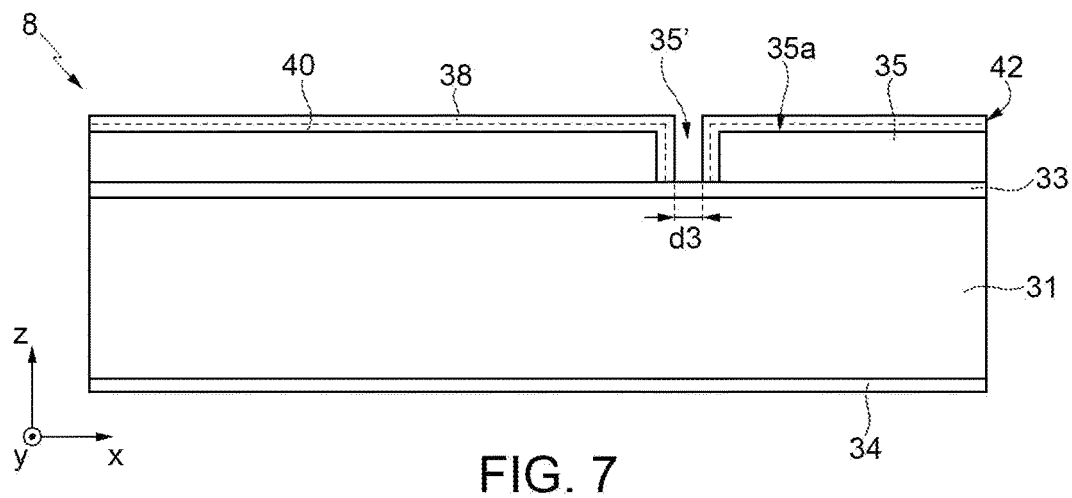

With reference to FIG. 7, an optional step of thermal oxidation of the wafer 8 is carried out, for example at a temperature comprised between 800° C. and 1100° C., to form a thermal-oxide layer 38 on the nozzle layer 35. This step has the function of enabling formation of the thin thermal-oxide layer 38 presenting a low surface roughness. Instead of by thermal oxidation, the aforesaid oxide may be deposited, totally or in part, for example with techniques of a CVD type.

The oxide layer 42 extends on the top face of the wafer 8 and within the through hole 35', coating the side walls thereof. The thickness of the oxide layer 42 is comprised between 0.2 μm and 2 μm.

The diameter $d_3$ of the through hole 35' resulting after the step of formation of the oxide layer 42 has a value comprised between 1 μm and 100 μm, for example equal to 20 μm.

Figure 8:
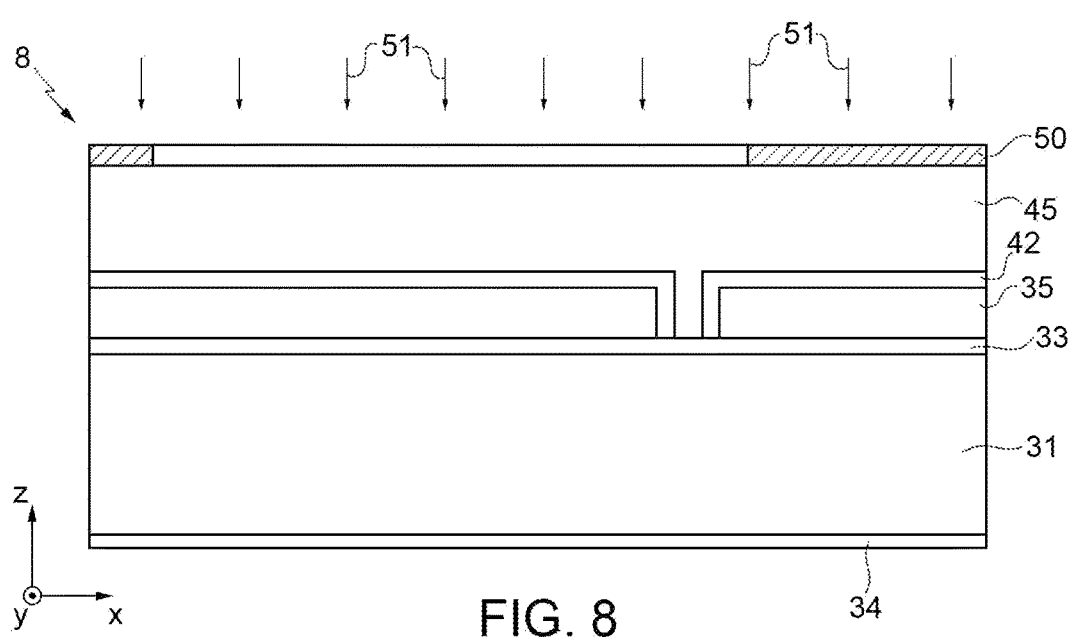

With reference to FIG. 8, formed on the oxide layer 42 is a structural layer 45, for example of polysilicon. The structural layer 45 has a final thickness comprised between 5 μm and 200 μm, for example 100 μm. The structural layer 45 is, for instance, grown epitaxially on the oxide layer 42 and within the through hole 35', until a thickness greater than the desired thickness is reached (for example, approximately 3-5 μm more), and is then subjected to a step of CMP to reduce the thickness thereof and obtain an exposed top surface with low roughness.

Figure 9:
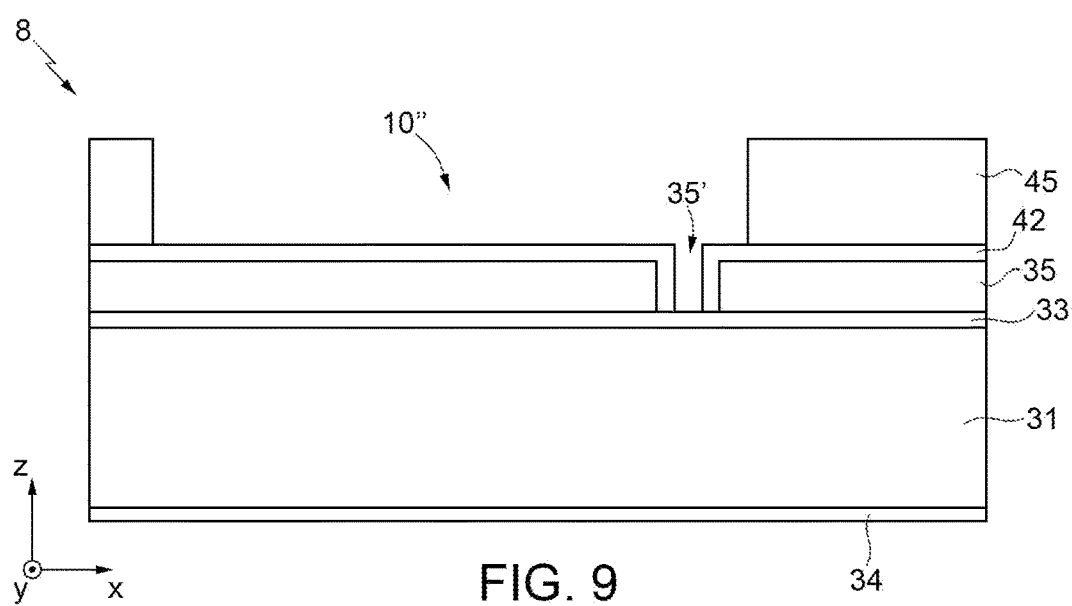

This is followed by formation of a second portion 10" of the chamber 10 and removal of the polysilicon that, in the previous step, has filled the through hole 35'. For this purpose, an etching mask 50 is provided on the structural layer, and an etching step (identified by the arrows 51) is carried out in the region where the through hole 35' had previously been formed. Etching is carried out with an etching chemistry designed to remove the polysilicon of which the structural layer 45 is made, but not the silicon oxide of the layer 42. Etching proceeds up to complete removal of the polysilicon that extends within the through hole 35' to form the second portion 10" of the chamber 10 through the structural layer 45 in fluid communication with the through opening 35', as illustrated in FIG. 9.

The thickness of the structural layer 45 defines the volume of the second portion 10" of the chamber 10. According to one aspect of the present disclosure, the volume defined by the second portion 10" is comprised between 90% and the 40% of the total volume designed for the chamber 10, and more in particular between 90% and 80% (as a function of the volume of the first portion 10' discussed previously).

Figure 10:
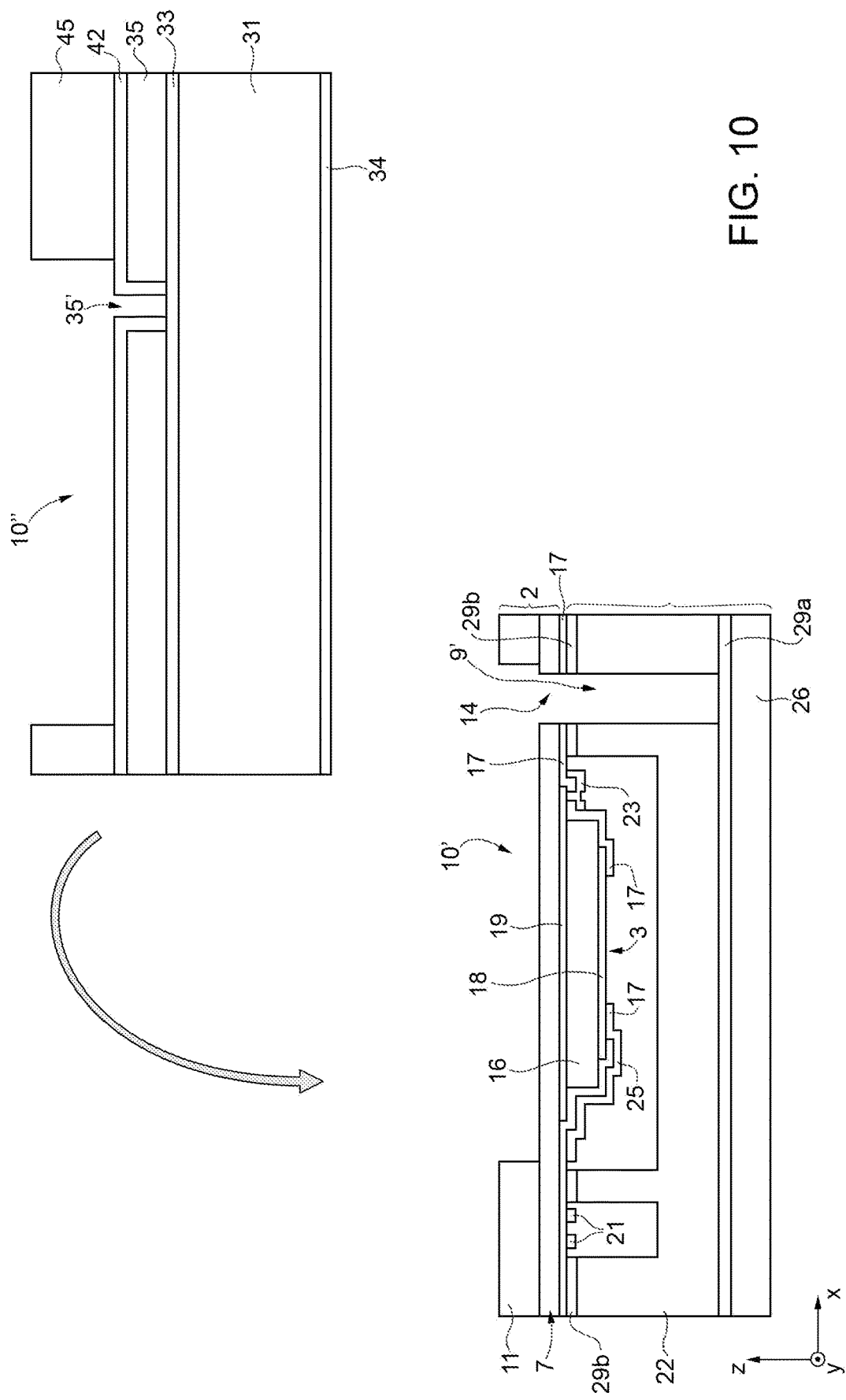

As illustrated in FIG. 10, the stack formed by the first and second wafers 2, 4 is coupled to the third wafer 8 via the wafer-to-wafer bonding technique using adhesive materials for the bonding 15, which may, for example, be polymeric, or else metallic, or else vitreous.

In particular, the third wafer 8 is coupled to the first wafer 2 so that the first and second portions 10', 10" concur in forming a single fluid-containment chamber, i.e., the chamber 10.

Figure 11:
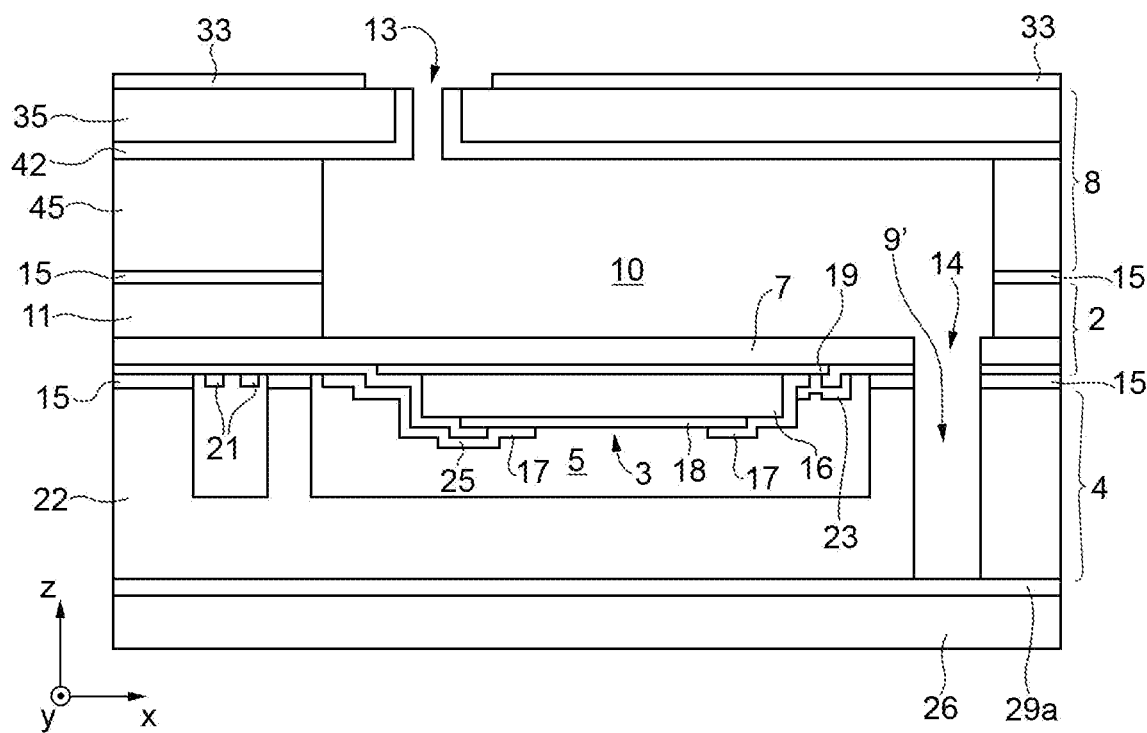

With reference to FIG. 11 the oxide layer 34 and the substrate 31 is removed. This step may be carried out by grinding the oxide layer 34 and part of the substrate 31, or else by a chemical etch, or else by a combination of these two processes.

Figure 12:
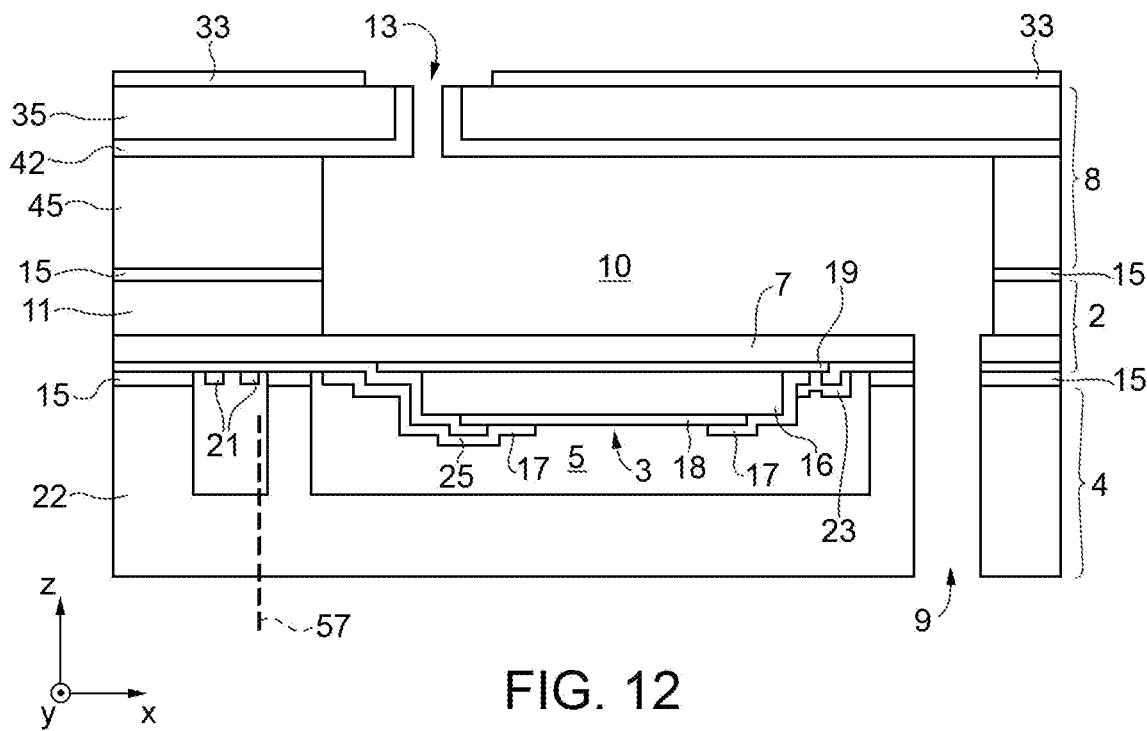

According to the embodiment of FIG. 12, the layer 33 is removed only at the top surface of the layer 35 (in the plane XY), and not along the inner walls of the nozzle 13 (for example, using an etching technique of a dry type, with an etching chemistry that is standard in semiconductor technologies).

According to one aspect of the present disclosure, the layer 33 is removed on the layer 35 only at the ink-outlet nozzles.

What has been described applies, in a similar way, also in the case where on the oxide layer 33 (or as an alternative thereto) one or more further anti-wettability layers were present. In this case, however, the step of removal of the structural layer 31 or 33 stops at the anti-wettability layer, which is not removed, or else is removed only along the walls of the nozzle 13 in the case where it were present.

Once again with reference to FIG. 12, formation of the inlet channel 9 is then completed by completely removing the structural layers 26 and 29a of the second wafer 4.

A step of partial sawing of just the second wafer 4, along the scribe line 57 illustrated in FIG. 12, enables removal of an edge portion thereof in a region corresponding to the conductive pads 21, so as to render them accessible from outside for a subsequent wire-bonding operation. The fluid-ejection device of FIG. 1 is thus obtained.

Figure 13:
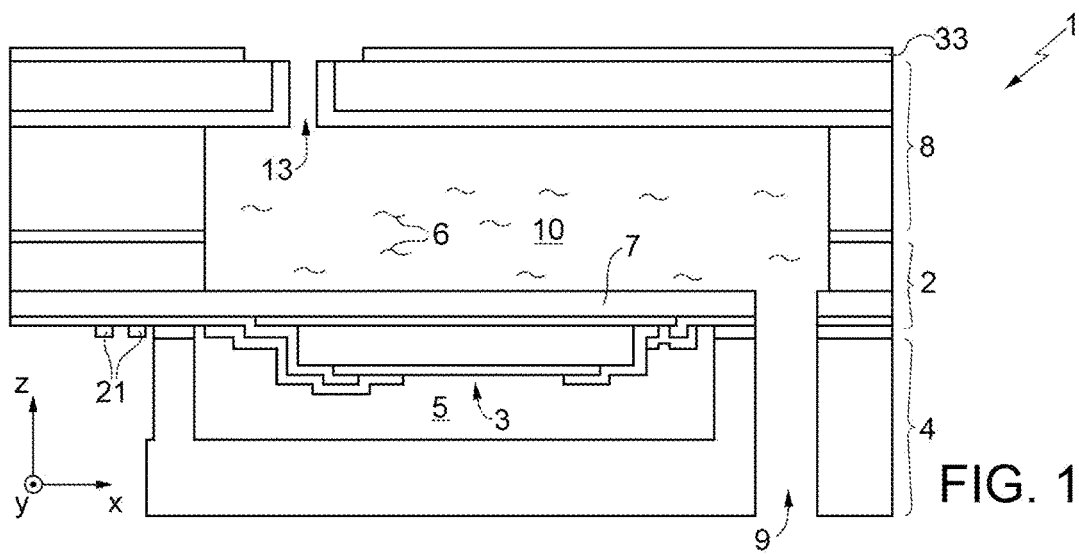
FIGS. 13-15 show the fluid-ejection device of FIG. 1 during respective operating steps.
Figure 14:
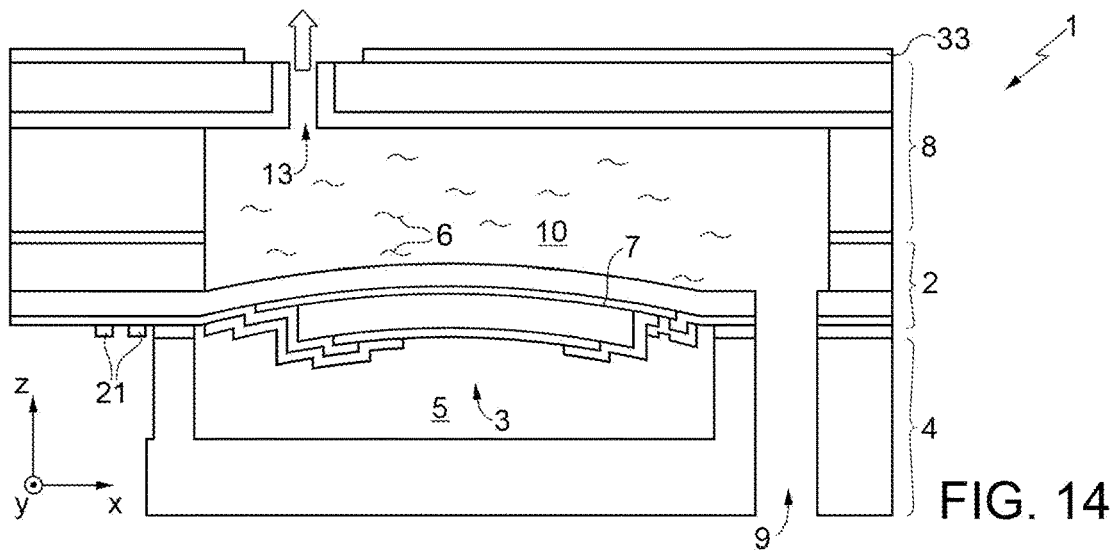
Figure 15:
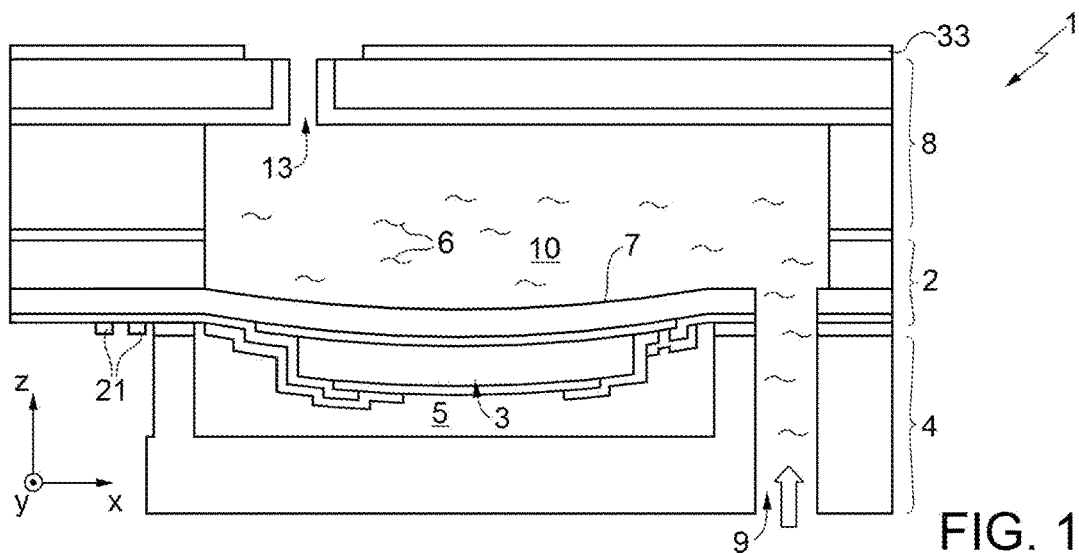

FIGS. 13-15 show the liquid-ejection device 1 in operating steps, during use.

In a first step (FIG. 13), the chamber 10 is filled by a fluid 6 that is to be ejected. This step of loading of the fluid 6 is carried out through the inlet channel 9.

With reference to FIG. 14, the piezoelectric actuator 3 is governed through the top and bottom electrodes 18, 19 (which are biased by the conductive paths 23, 25) so as to generate a deflection of the membrane 7 towards the inside of the chamber 10. This deflection causes a movement of the fluid 6, which, from the chamber 10, passes directly (i.e., without intermediate channels) in the nozzle 13, with consequent controlled ejection of a drop of fluid 6 towards the outside of the fluid-ejection device 1.

With reference to FIG. 15, the piezoelectric actuator 3 is governed through the top and bottom electrodes 18, 19 so as to generate a deflection of the membrane 7 in a direction opposite to the one illustrated in FIG. 14 so as to increase the volume of the chamber 10, further recalling fluid 6 towards the chamber 10 through the inlet channel 9. The chamber 10 is thus recharged with fluid 6. It is thus possible to proceed cyclically by operating the piezoelectric actuator 3 for ejection of further drops of fluid. The steps of FIGS. 14 and 15 are then repeated throughout the printing process.

Operation of the piezoelectric element by biasing of the top and bottom electrodes 18, 19 is per se known and not described in detail herein.

From an examination of the characteristics of the disclosure provided herein, the advantages that it affords are evident.

In particular, the direct fluidic connection between the chamber 10 and the nozzle 13 enables optimization of the resonance frequency of the print head in all the operating conditions, and likewise enables an increase in the velocity of ejection of fluid from the nozzle 13.

Furthermore, the steps of production of the nozzle are carried out on the third wafer 8 prior to coupling of the latter to the first wafer 2. This makes possible the use of a wide range of micromachining technologies without running the risk of damaging the coupling layers between the first and the third wafers 2, 4. In addition, it is possible to form a high-wettability layer (e.g., of silicon oxide) within the hole that defines the nozzle 13 in a simple and inexpensive way.

Further, it should be noted that the steps of production of the liquid-ejection device specify coupling of just three wafers, thus reducing the risks of misalignment in so far as just two steps of coupling of wafers are desired, thus limiting the manufacturing costs.

Figure 16A:
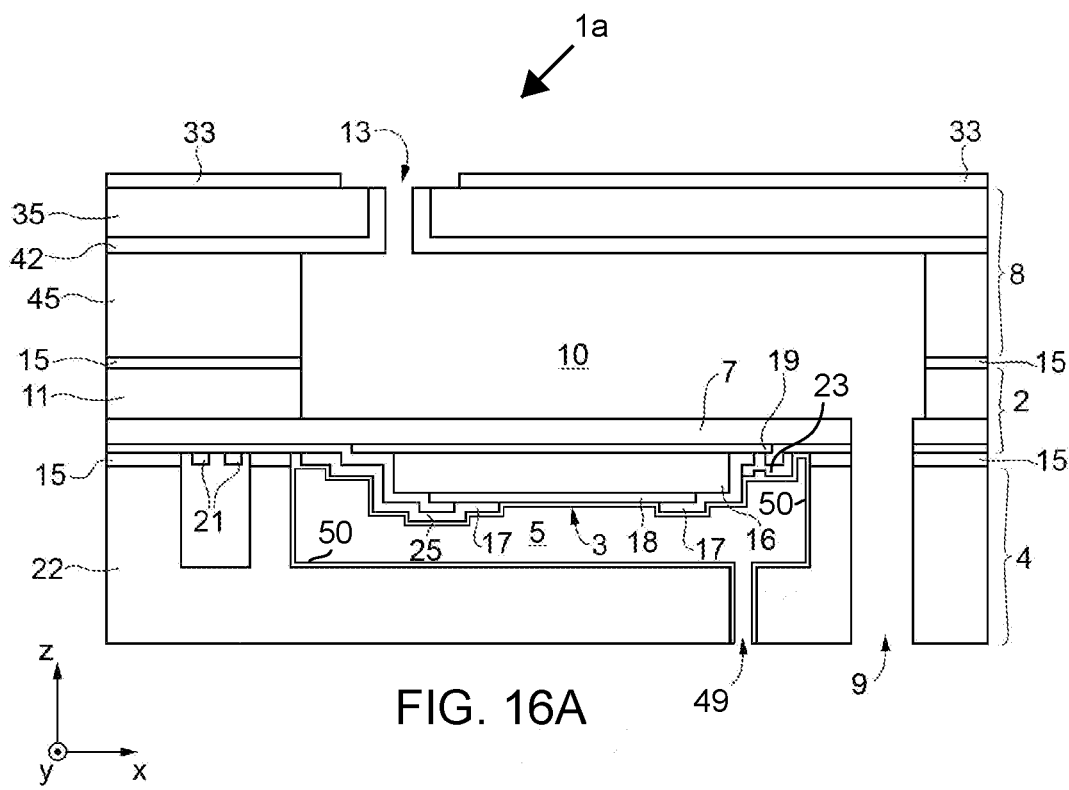
FIGS. 16A and 16B show a fluid-ejection device according to another embodiment.

With reference to FIG. 16A, the liquid-ejection device 1a shown is the same stage of manufacture as the liquid-ejection device 1 of FIG. 12 except that the liquid-ejection device 1a includes a further processing step. In particular, the manufacturing of the liquid-ejection device 1a includes forming a through hole 49 in the substrate 22 to the chamber 5. The chamber 5 walls, which may include the piezoelectric actuator 3, are then coated with an insulative material. In particular, the chamber walls, and possibly the piezoelectric actuator 3, are coated by introducing an atomic layer deposition (ALD) of a layer hafnium dioxide 50 through the through hole 49. The layer of hafnium dioxide 50 provides a barrier against humidity. Upon forming the layer of hafnium dioxide 50, the through hole 49 may then be closed by known methods.

Figure 16B:
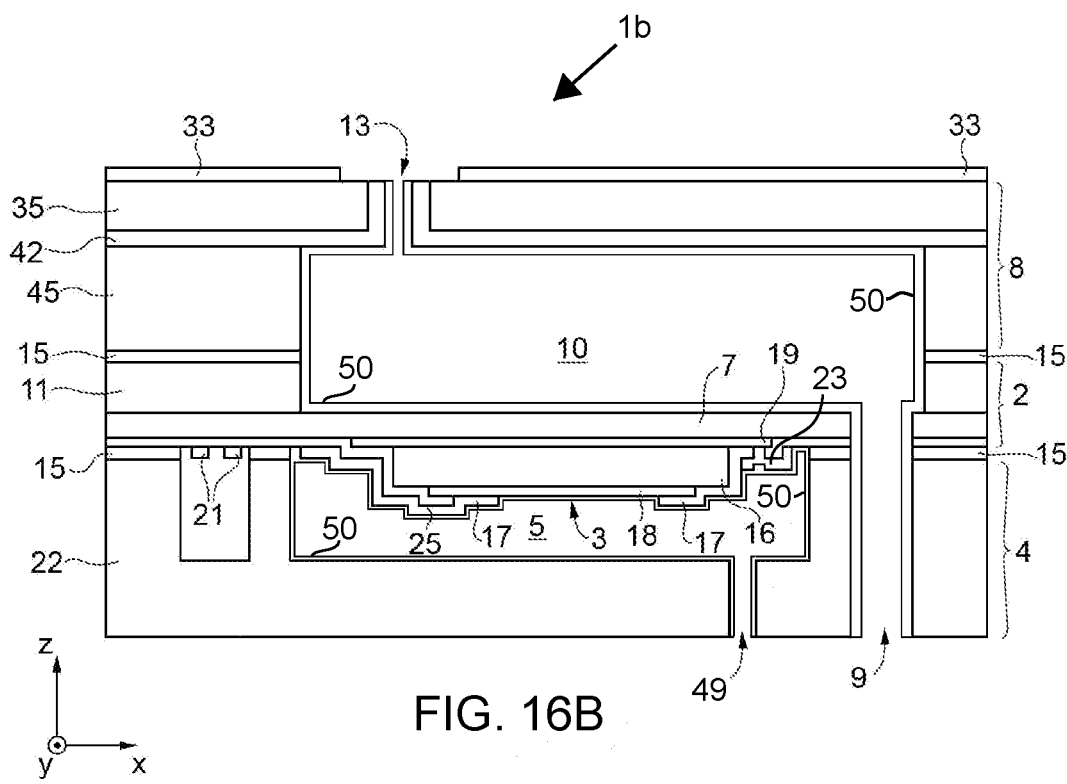

With reference to FIG. 16B, the liquid-ejection device 1b shows a similar stage of manufacture as the liquid-ejection device 1a of FIG. 16A, except that the liquid-ejection device 1b includes yet a further processing step. In particular, the manufacturing of the liquid-ejection device 1b includes coating more layers of the device, such as surfaces of the chamber 10, the trench 9, and the nozzle 13 with the insulative layer, such as by ALD of a layer of hafnium dioxide 50. Furthermore, the layer of hafnium dioxide may be located on outer layers of the liquid-ejection device 1b, such as on an outer layer of substrate 22. The layer of hafnium dioxide protects the surfaces, such as surfaces of the chamber and the conduits, such as the trench 9 and the nozzle 13, against corrosive inks to be used with the device.

Finally, it is clear that modifications and variations may be made to what has been described and illustrated herein, without thereby departing from the scope of the present disclosure.

In particular, as illustrated in the figures, the present disclosure applies, in a per se known manner to the person skilled in of the art on the basis of what has been set forth above, also to fluid-ejection devices that have, in addition to the inlet hole or channel 9, a further recirculation hole or channel, coupled to the fluid-containment chamber 10 to enable recirculation of the fluid 6 not ejected through the nozzle 13. A fluid-ejection device of this type is described, for example, in the U.S. Pat. No. 9,744,765.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device for ejecting a fluid, comprising:
a first semiconductor body including a first portion of a chamber, the first portion having a plurality of first sidewalls surrounding the first portion of the chamber; and
a second semiconductor body including a membrane and a second portion of the chamber, the second portion having a plurality of second sidewalls surrounding the second portion of the chamber,
wherein the first and second semiconductor bodies are coupled together, the plurality of first sidewalls being aligned with the plurality of second sidewalls, the plurality of first sidewalls and the plurality of second sidewalls laterally surround the chamber, and
wherein the first portion of the chamber has a first volume of a total volume of the chamber and the second portion of the chamber has a second volume of the total volume of the chamber, the first volume being larger than the second volume.

2. The ejection device according to claim 1, further comprising an actuator operatively coupled to the membrane.

3. The fluid ejection device of claim 2, wherein the actuator is a piezoelectric-actuation structure.

4. The ejection device according to claim 1, wherein the first semiconductor body includes a first structural layer and the second semiconductor body includes a second structural layer, the first portion of the chamber being in the first structural layer and the second portion of the chamber being in the second structural layer, a thickness of the second structural layer is less than a thickness of the first structural layer.

5. The ejection device according to claim 1, wherein the first volume of the first portion of the chamber is 60% and 90% of the total volume of the chamber.

6. The ejection device according to claim 1, further comprising a third semiconductor body coupled to the second semiconductor body, the third semiconductor body including an inlet through hole fluidically coupled to the chamber.

7. A fluid ejection device, comprising:
a first semiconductor body including a nozzle, a first recess, and a plurality of first sidewalls surrounding the first recess; and
a second semiconductor body including a membrane a second recess, and a plurality of second sidewalls surrounding the second recess, the second semiconductor body coupled to the first semiconductor body;
a chamber that includes the first and second recesses, the chamber configured to hold a fluid, the plurality of first sidewalls are aligned with the plurality of second sidewalls, the first recess of the first semiconductor body has a first volume of a total volume of the chamber and the second recess of the second semiconductor body has a second volume of the total volume of the chamber, the first volume being larger than the second volume.

8. The fluid ejection device according to claim 7, further comprising an actuator coupled to the membrane.

9. The fluid ejection device of claim 8, wherein the actuator is a piezoelectric actuator.

10. The fluid ejection device according to claim 7, wherein the first recess of the first semiconductor body is 60% to 90% of the total volume of the chamber.

11. The fluid ejection device according to claim 7, further comprising a third semiconductor body coupled to the second semiconductor body, the third semiconductor body including an inlet configured to receive the fluid and provide the fluid to the chamber.

12. The fluid ejection device according to claim 11, wherein the third semiconductor body includes a cavity, wherein the actuator is in the cavity.

13. The fluid ejection device according to claim 12, wherein a surface in the cavity is covered by a layer of hafnium dioxide.

14. The fluid ejection device according to claim 7, wherein the nozzle is configured to eject the fluid from the chamber in response to the membrane deflecting.

15. The fluid ejection device according to claim 7, wherein the first semiconductor body includes a first structural layer and the second semiconductor body includes a second structural layer, the first recess being formed in the first structural layer and the second recess being formed in the second structural layer, the first structural layer being thicker than the second structural layer.

16. A fluid ejection device, comprising:

a first semiconductor body including a first surface and a plurality of first sidewalls extending from the first surface, the first semiconductor body having a second surface, the plurality of first sidewalls have a first dimension between the first and second surfaces;

a second semiconductor body coupled to the first semiconductor body, the second semiconductor body including a third surface and a plurality of second sidewalls extending from the third surface, the second semiconductor body having a fourth surface, the plurality of second sidewalls having a second dimension between the third and fourth surface, the second dimension is less than the first dimension;

a chamber that includes the plurality of first sidewalls and the plurality of second sidewalls, the chamber configured to contain a liquid.

17. The fluid ejection device of claim 16, wherein a thickness of the second semiconductor body is less than the thickness of the first semiconductor body.

18. The fluid ejection device of claim 16, wherein the second semiconductor body further comprises a membrane having the second surface.

19. The fluid ejection device of claim 16, wherein the first semiconductor body includes a nozzle that extends through the first surface of the first semiconductor body and is in direct fluid communication with the chamber configured to contain the liquid.

20. The fluid ejection device of claim 16, further comprising an actuator operatively coupled to the membrane, the actuator configured to deflect the membrane.

\* \* \* \* \*